US006265773B1

United States Patent
Kinsman et al.

(10) Patent No.: US 6,265,773 B1
(45) Date of Patent: Jul. 24, 2001

(54) VERTICALLY MOUNTABLE AND ALIGNABLE SEMICONDUCTOR DEVICE, ASSEMBLY, AND METHODS

(75) Inventors: Larry D. Kinsman, Boise; Walter L. Moden, Meridian; Warren M. Farnworth, Nampa, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/416,357

(22) Filed: Oct. 12, 1999

Related U.S. Application Data

(63) Continuation of application No. 09/002,160, filed on Dec. 31, 1997.

(51) Int. Cl.⁷ .................................................. H01L 21/302
(52) U.S. Cl. ............................................ 257/723; 257/685
(58) Field of Search ............................. 257/685, 686, 257/723, 724, 725, 726, 778, 710, 690, 698, 699

(56) References Cited

U.S. PATENT DOCUMENTS

| Re. 34,794 | 11/1994 | Farnworth | 257/678 |
|---|---|---|---|
| 4,920,074 | 4/1990 | Shimizu et al. | 29/827 |
| 5,082,459 | * 1/1992 | Billman et al. | 439/637 |
| 5,086,018 | 2/1992 | Conru et al. | 29/827 |
| 5,234,866 | 8/1993 | Okinaga et al. | 29/827 |
| 5,279,029 | * 1/1994 | Burns | 29/856 |
| 5,294,897 | 3/1994 | Notani et al. | 333/33 |
| 5,313,097 | * 5/1994 | Haj-Ali-Ahmadi et al. | 257/706 |
| 5,327,327 | 7/1994 | Frew et al. | 361/784 |
| 5,406,699 | 4/1995 | Oyama | 29/827 |
| 5,444,304 | 8/1995 | Hara et al. | 257/796 |
| 5,450,289 | 9/1995 | Kweon et al. | 361/773 |
| 5,451,815 | 9/1995 | Taniguchi et al. | 257/696 |
| 5,484,959 | 1/1996 | Burns | 174/52.4 |
| 5,545,924 | * 8/1996 | Contolatis et al. | 257/724 |
| 5,581,877 | 12/1996 | Woychik et al. | 29/852 |
| 5,592,019 | 1/1997 | Ueda et al. | 257/666 |
| 5,593,927 | * 1/1997 | Farnworth et al. | 438/113 |
| 5,616,962 | 4/1997 | Ishikawa et al. | 257/717 |
| 5,619,067 | 4/1997 | Sua et al. | 257/686 |
| 5,623,395 | 4/1997 | Derouiche et al. | 361/735 |
| 5,635,760 | 6/1997 | Ishikawa | 257/692 |
| 5,644,161 | 7/1997 | Burns | 257/668 |
| 5,661,339 | * 8/1997 | Clayton | 257/678 |
| 5,726,492 | 3/1998 | Suzuki et al. | 257/685 |
| 5,786,985 | 7/1998 | Taniguchi et al. | 361/707 |
| 5,790,380 | * 8/1998 | Frankeny | 361/735 |
| 5,802,709 | 9/1998 | Hogge et al. | 29/827 |
| 5,918,516 | 7/1999 | Norell et al. | 83/13 |
| 5,996,458 | 12/1999 | Maeda | 83/456 |
| 6,049,975 | 4/2000 | Clayton | 29/832 |
| 6,091,606 | 7/2000 | Farnworth et al. | 361/760 |
| 6,098,279 | 8/2000 | Lee | 29/832 |
| 6,122,822 | 9/2000 | Liao | 29/827 |
| 6,151,220 | 11/2000 | Sakamoto et al. | 361/733 |

FOREIGN PATENT DOCUMENTS

| 2104827 | 3/1983 | (GB) . |
|---|---|---|
| 5-129481 | * 5/1993 | (JP) . |

* cited by examiner

*Primary Examiner*—Stephen D. Meier
*Assistant Examiner*—Jeff Vockrodt
(74) *Attorney, Agent, or Firm*—TraskBritt

(57) ABSTRACT

A vertically mountable semiconductor device including a plurality of stub contacts extending perpendicularly from a bottom edge thereof. A complementary alignment device includes a receptacle for receiving the vertically mountable semiconductor device. The alignment device is attachable to a carrier substrate. Upon attachment of the alignment device to a carrier substrate and insertion of a vertically mountable semiconductor device into the receptacle, a contact element applies a downward force to the vertically mountable semiconductor device to establish and maintain an electrical connection between the vertically mountable semiconductor device and the carrier substrate.

28 Claims, 4 Drawing Sheets

VERTICALLY MOUNTABLE AND ALIGNABLE SEMICONDUCTOR DEVICE, ASSEMBLY, AND METHODS

CROSS REFERENCE TO RELATED APPLICATION

This application is a continuation of application Ser. No. 09/002,160, filed Dec. 31, 1997, pending.

BACKGROUND OF THE INVENTION

1. Field of the Invention

The present invention relates to vertically mountable semiconductor devices and devices which orient semiconductor devices perpendicularly relative to a carrier substrate. In particular, this invention relates to vertical surface mount package assemblies and alignment devices for biasing leads of the semiconductor device against terminals on a carrier substrate to establish and maintain electrical communication therebetween. The present invention also relates to vertical surface mount packages with low impedance and to user-upgradable, vertical surface mount package assemblies.

2. State of the Art

Vertical surface mount packages are known in the art. When compared with traditional, horizontally mountable semiconductor packages and horizontally oriented multi-chip packages, many vertical surface mount packages have a superior ability to transfer heat. Vertical surface mount packages also consume less area on a carrier substrate than a horizontally mounted package of the same size. Thus, many skilled individuals in the semiconductor industry are finding vertical surface mount packages more desirable than their traditional, horizontally mountable counterparts.

Exemplary vertical surface mount packages are disclosed in the following U.S. Patents: Re. 34,794 (the "'794 patent"), issued to Warren M. Farnworth on Nov. 22, 1994; U.S. Pat. No. 5,444,304 (the "'304 patent"), issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

The '794 patent discloses a vertical surface mount package having a gull-wing, zig-zag, in-line lead configuration and a mechanism for mounting the package to a printed circuit board (PCB) or other carrier substrate. The force with which the package mounts to the carrier substrate establishes a tight interference contact between the package's leads and their corresponding terminals on the carrier substrate.

The '304 patent describes a vertical surface mount package which has integrally formed fins radiating therefrom. The fins of that device facilitate the dissipation of heat away from the device. The semiconductor device is electrically connected to the package's leads by wire bonding. The leads of that vertical surface mount package, which extend therefrom in an in-line configuration, are mountable to the terminals of a carrier substrate by soldering.

However, many of the vertical surface mount packages in the prior art are somewhat undesirable from the standpoint that they permanently attach to a carrier substrate. Thus, those vertical surface mount packages are not readily user-upgradable. Moreover, many prior art vertical surface mount packages include relatively long leads, which tend to increase the impedance of the leads and reduce the overall speed of systems of which they are a part. Similarly, the wire bonding typically used in many vertical surface mount packages increases the impedance and reduces the overall speed of such devices. As the speed of operation of semiconductor devices increases, more heat is generated by the semiconductor device, requiring greater heat transfer. Similarly, as the speed of operation of semiconductor devices increases, it is important to decrease the length of the leads regarding circuitry connecting the semiconductor device to other components and thereby decrease the impedance of the leads to increase the responsiveness of the semiconductor device.

Vertical surface mount package sockets are also known in the art. Vertical surface mount package sockets support one or more vertical surface mount packages relative to a carrier substrate. Exemplary devices are disclosed in U.S. Pat. No. 5,619,067 (the "'067 patent"), which issued to Goh J. Sua and Chan M. Yu on Apr. 8, 1997 and U.S. Pat. No. 5,644,161 (the "'161 patent"), which issued to Carmen D. Burns on Jul. 1, 1997. The '161 patent does not describe the platform shown therein in any detail.

The '067 patent discloses a mechanism for vertically mounting a plurality of vertical surface mount packages onto a carrier substrate. A plurality of vertical surface mount packages is installed upside-down within a cover, and against one another in a side-by-side arrangement. The cover is then inverted and attached to the carrier substrate. Clips on each side of the cover insert through and engage an edge of holes formed through the carrier substrate. The downward force of the cover on the vertical surface mount packages forces the leads against the corresponding contacts on the carrier substrate, creating electrical contact therebetween.

The cover of the '067 patent is somewhat undesirable for several reasons. First, the vertical surface mount packages illustrated by that patent have conventional, long, bent leads. Such long leads tend to increase the impedance of such vertical surface mount packages. Second, the cover, as described, includes no mechanism for aligning the devices so that the corresponding leads and carrier substrate contacts match up to each other. The only alignment mechanism described by the '067 patent is the two clips on the cover and the corresponding crude holes formed through the carrier substrate. Further, in order to effectively position the vertical surface mount packages and maintain adequate electrical contact between the vertical surface mount packages and the carrier substrate, the cover device of the '067 patent must be filled to capacity with vertical surface mount packages. The illustrated clip-hole attachment mechanism also seems inadequate for establishing and maintaining an adequate interference contact between the vertical surface mount package leads and the carrier substrate contacts.

What is needed is a low impedance, vertical surface mount package which is readily removable from and reinstallable upon a carrier substrate. A vertical surface mount package alignment and attachment device which transfers heat away from the vertical surface mount package and establishes and maintains adequate electrical connections between a vertical surface mount package and a carrier substrate is also needed.

SUMMARY OF THE INVENTION

The vertically mountable semiconductor device assembly of the present invention includes very short stub contacts, which impart it with low impedance. The assembly of the present invention includes an alignment device, which exerts consistent downward force upon all of the vertically mountable semiconductor devices disposed therein to establish and maintain an electrical connection between the vertically mountable semiconductor device(s) and the carrier substrate. Vertically mountable semiconductor devices are readily removable from and reinsallable in the alignment device, making the device user-upgradable.

An embodiment of the system of the present invention includes a vertically mountable semiconductor device and an alignment device which attaches the vertically mountable semiconductor device to a carrier substrate. The alignment device of the present invention includes one or more receptacles formed therethrough, each of which receives and aligns at least one vertically mountable semiconductor device. The alignment device also includes a mechanism, which is referred to as a contact element, for biasing the vertically mountable semiconductor device(s) disposed within the receptacle(s) against the carrier substrate. A preferred contact element is a cover which exerts constant force on the vertically mountable semiconductor device to establish and maintain a connection with a carrier substrate. A preferred engagement mechanism releasably engages the vertically mountable semiconductor device(s) that has been inserted into the alignment device receptacle(s).

In use, the alignment device is mounted to a carrier substrate, one or more vertically mountable semiconductor devices are inserted into the receptacle(s) thereof, and the contact element engages the vertically mountable semiconductor device(s), exerting downward force thereon to establish and maintain an electrical connection between stub contacts on the vertically mountable semiconductor device (s) and corresponding terminals on the carrier substrate. Disengagement of the contact element facilitates the ready removal of the vertically mountable semiconductor device (s) from the alignment device. Consequently, each vertically mountable semiconductor device is readily removable from the receptacle and may also be readily replaced therein.

A vertically mountable semiconductor device which may be used in the system of the present invention has a plurality of short stub contacts extending therefrom. Preferably, the lead length is less than about one millimeter (mm). More preferably, the lead length is less than about one-half (½) mm. Shorter lead lengths of about 10 mils or less are even more preferred due to the decrease in impedance as lead length decreases. Thus, it is a consequent advantage that vertically mountable semiconductor devices which are useful in the system of the present invention have reduced impedance.

The present invention also includes a method for fabricating the vertically mountable semiconductor device and a method for modifying existing vertical surface mount packages to manufacture the vertically mountable semiconductor device of the present invention. A computer which includes the vertically mountable semiconductor device of the present invention is also within the scope of the invention.

Other advantages of the present invention will become apparent through a consideration of the appended drawings and the ensuing description.

BRIEF DESCRIPTION OF THE SEVERAL VIEWS OF THE DRAWINGS

FIG. 2 is a frontal perspective view of a vertically mountable semiconductor device which is useful in the assembly of FIG. 1a;

DETAILED DESCRIPTION OF THE INVENTION

Figure 1A:
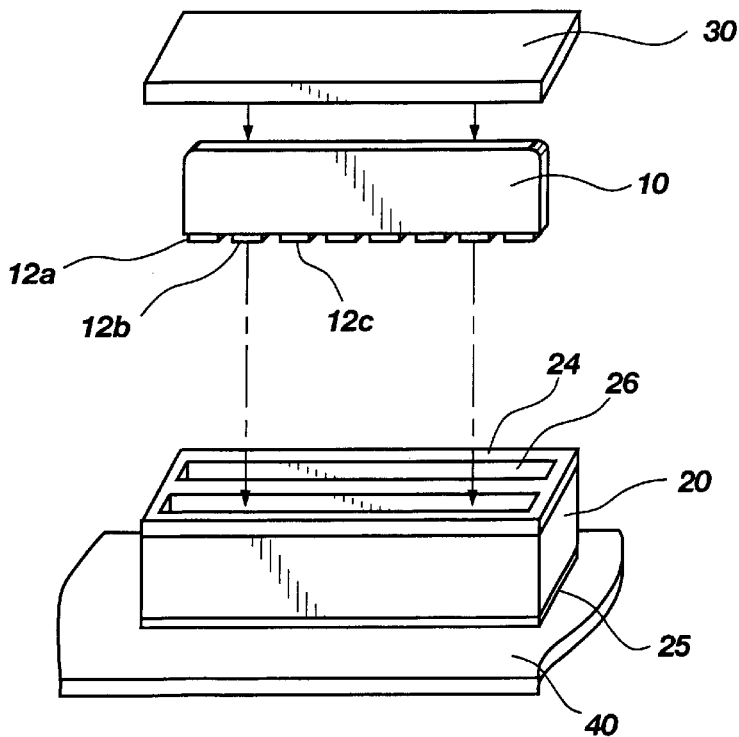
FIG. 1a is a perspective assembly view of a first embodiment of the vertically mountable semiconductor device assembly according to the present invention.
Figure 1B:
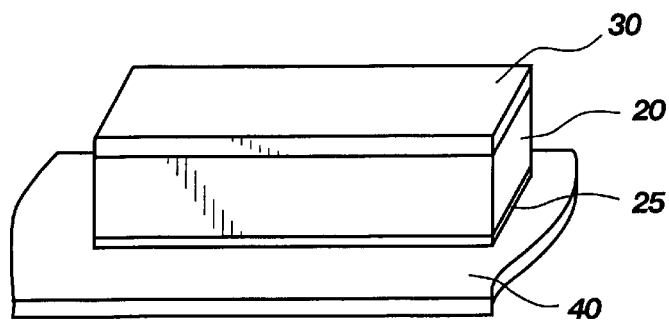
FIG. 1b is a frontal perspective view of the vertically mountable semiconductor device assembly of FIG. 1a, showing the cover disposed on the alignment device.

With reference to FIG. 1a, a vertically mountable semiconductor device assembly according to the present invention includes a vertically mountable semiconductor device 10, an alignment device 20, and a cover 30, which is also referred to as a contact element. Alignment device 20 attaches to a carrier substrate 40 by a substrate attachment mechanism 25. As FIG. 1b illustrates, cover 30 is disposable over alignment device 20. Preferably, cover 30 is removable from and replaceable upon alignment device 20 in order to permit a user to upgrade the vertically mountable semiconductor devices installed within the alignment device.

Figure 2:
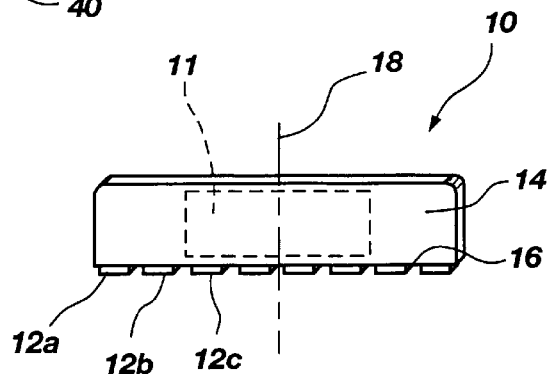

FIG. 2 depicts a vertically mountable semiconductor device 10 according to the present invention, which includes a cover 14 that encloses an integrated circuit die 11, a bottom edge 16 on the cover, and a plurality of stub contacts 12a, 12b, 12c, etc. extending from the bottom edge. Preferably, stub contacts 12a, 12b, 12c, etc. extend perpendicular to bottom edge 16. At least a portion of stub contacts 12a, 12b, 12c, etc. are electrically connected to bond pads on integrated circuit die 11. Stub contacts 12a, 12b, 12c, etc. are manufactured from materials which are known in the art, including, without limitation, copper alloys, iron-nickel (Fe—Ni) alloys, and iron-nickel-cobalt (Fe—Ni—Co) alloys. Typical leads have a thickness of about 4 mils to about 10 mils. As a result of their materials and thinness, typical semiconductor leads are compliant. Due to the compliance of typical semiconductor leads, stub contacts 12a, 12b, 12c, etc. are preferably very short and straight in order to reduce their tendency to buckle as load is placed thereon. Preferably, stub contacts 12a, 12b, 12c, etc. (collectively referred to as "stub contacts 12") extend from cover 14 a length of less than about 1 mm. More preferably, stub contacts 12 extend from cover 14 a length of less than about one-half (½) mm. Even more preferred are stub contact 12 lengths of about 10 mils or less. Moreover, the relatively short length of stub contacts 12a, 12b, 12c, etc. reduces the amount of impedance that is generated thereby and increases the overall speed of the device of which they are a part, relative to many vertical surface mount packages in the prior art.

Vertically mountable semiconductor device 10 has a standardized number of stub contacts 12a, 12b, 12c, etc., which are spaced apart from one another at a standardized pitch, and which may be positioned at a specific location relative to a center line 18 of the vertically mountable semiconductor device 10, or relative to any other landmark on the vertically mountable semiconductor device, such as a side thereof Alternatively, the number and pitch of stub contacts 12 may be non-standardized.

Vertically mountable semiconductor device 10 may be packaged by methods which are known in the art. However, the leads of many vertical surface mount packages in the prior art are trimmed to a desired length, then bent to a desired shape. In comparison, stub contacts 12a, 12b, 12c, etc., of vertically mountable semiconductor device 10 are merely trimmed to a short length. Thus, at least one step is eliminated from the packaging process, which reduces the overall manufacturing cost of the vertically mountable semiconductor device of the present invention relative to other vertical surface mount packages in the prior art. Additionally, due to the reduced length of stub contacts 12a, 12b, 12c, etc. relative to such devices, less material is required to form each lead, further reducing the cost of vertically mountable semiconductor device 10.

Alternatively, a vertically mountable semiconductor device which has longer leads and/or bent leads, including many vertical surface mount packages in the prior art, may also be used in the assembly of the present invention.

Referring again to FIG. 1a, alignment device 20 includes one or more receptacles 26 defined by an alignment device body 24. Preferably, receptacles 26 extend completely through alignment device 20. Receptacle 26 orients vertically mountable semiconductor device 10 vertically with respect to carrier substrate 40, and aligns stub contacts 12a, 12b, 12c, etc. relative to their respective terminals (not shown) on the carrier substrate. Preferably, the shape and size of receptacle 26 facilitates the insertion and alignment of vertically mountable semiconductor device 10. Thus, receptacle 26 is slightly larger than vertically mountable semiconductor device 10. Alternatively, the vertically mountable semiconductor device 10 may include a guide which corresponds to a guide in the alignment device receptacle 26. Thus, as the vertically mountable semiconductor device 10 is inserted into the receptacle, the guide aligns stub contacts 12a, 12b, 12c with respect to their corresponding terminals (not shown) on carrier substrate 40.

Preferably, alignment device 20 is thin-walled in order to conserve area or "real estate" on carrier substrate 40. A preferred alignment device 20 material, such as ceramic, glass, copper, aluminum or another "heat sink" material, has good thermal conductivity properties. Alternatively, alignment device 20 may be manufactured from materials such as plastics and epoxy resins. Preferably, cover 30 is made from the same material as alignment device 20.

As mentioned above, alignment device 20 is attached to carrier substrate 40 with a substrate attachment mechanism 25. As illustrated in FIG. 1a, a preferred substrate attachment mechanism 25 is a layer of z-axis elastomer. However, other mechanisms which are known in the art are useful for attaching alignment device 20 to carrier substrate 40, including, without limitation, screws, epoxies, acrylics, tabs and adhesives.

Figure 3A:
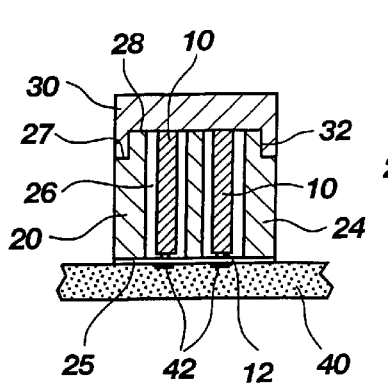
FIGS. 3a through 3c are cross-sectional views of exemplary alignment device-cover combinations that are usefull in the assembly of FIG. 1a, which illustrate various embodiments of the alignment device, the cover, the electrical connection of package stub contacts to carrier substrate terminals, and the attachment of the alignment device to the carrier substrate.
Figure 3B:
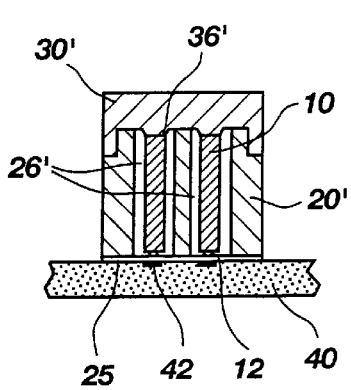
Figure 3C:
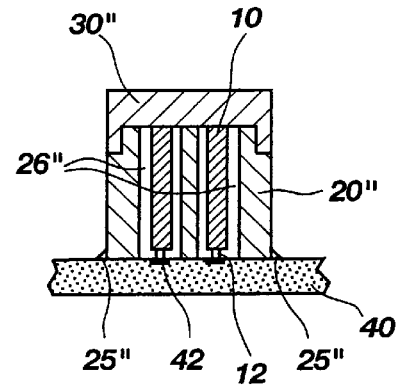

FIGS. 3a through 3c illustrate various embodiments of covers and alignment devices according to another aspect of the present invention. FIG. 3a shows a first variation 20 of an alignment device which includes a receptacle 26 extending therethrough. The height of receptacle 26 is slightly less than that of a vertically mountable semiconductor device 10 insertable therein. Thus, as a corresponding first variation 30 of a cover is secured to alignment device 20, the cover exerts a downward force on vertically mountable semiconductor device 10 to establish and maintain an electrical contact between stub contacts 12 and their corresponding terminals 42 on carrier substrate 40. FIG. 3a also illustrates a thin layer of a z-axis elastomer 25, which secures alignment device 20 to carrier substrate 40, and through which an electrical connection is established between stub contacts 12 and terminals 42.

FIG. 3b depicts second variations of an alignment device 20' and a cover 30' that are useful in the present invention. The receptacles 26' of alignment device 20' have about the same or a greater height than that of a vertically mountable semiconductor device 10 insertable therein. Cover 30' includes a depressor component 36', which exerts adequate downward force on vertically mountable semiconductor device 10 to establish and maintain an electrical connection between stub contacts 12 and their respective terminals 42. Depressor component 36' is a short downward extension of cover 30' which is adapted to insert into receptacle 26' and apply a constant downward force on vertically mountable semiconductor device 10. As depicted, alignment device 20' may be secured to carrier substrate 40 with a thin layer of z-axis elastomer 25.

FIG. 3c shows a third variation of an alignment device 20" and a cover 30", which are substantially the same as the alignment device and cover described above in reference to FIG. 3a. However, the assembly shown in FIG. 3c lacks a z-axis elastomer. Rather, alignment device 20" is attached to carrier substrate 40 with an attachment mechanism 25" which may include, but is not limited to, screws, epoxies and adhesive materials. The downward force of cover 30" on a vertically mountable semiconductor device 10 which has been inserted into receptacle 26" establishes and maintains an interference fit between stub contacts 12, which extend from the vertically mountable semiconductor device, and their respective terminals 42 on carrier substrate 40. Thus, the downward force of cover 30" on vertically mountable semiconductor device 10 establishes and maintains electrical connections between each of the stub contacts 12 and its corresponding terminal 42.

Different combinations of the alignment device, cover, and securing mechanism, as well as variations thereof, which orient and align a vertically mountable semiconductor device perpendicularly relative to a carrier substrate and which establish and maintain an electrical connection between the vertically mountable semiconductor device's stub contacts and their respective terminals on the carrier substrate are also contemplated to be within the scope of the present invention.

In order to exert sufficient downward force on a vertically mountable semiconductor device disposed within an alignment device's receptacle, the cover must be secured to the alignment device. FIGS. 4a through 4d illustrate various exemplary alignment device-cover combinations and their respective securing mechanisms.

Figure 4D:
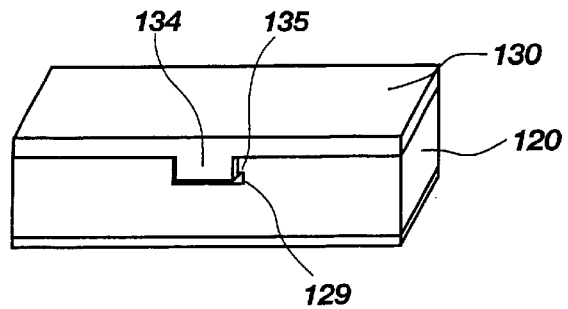
FIG. 4d is a frontal perspective view of a cover and alignment device which includes another variation of a mechanism for securing the cover to the alignment device.
Figure 4A:
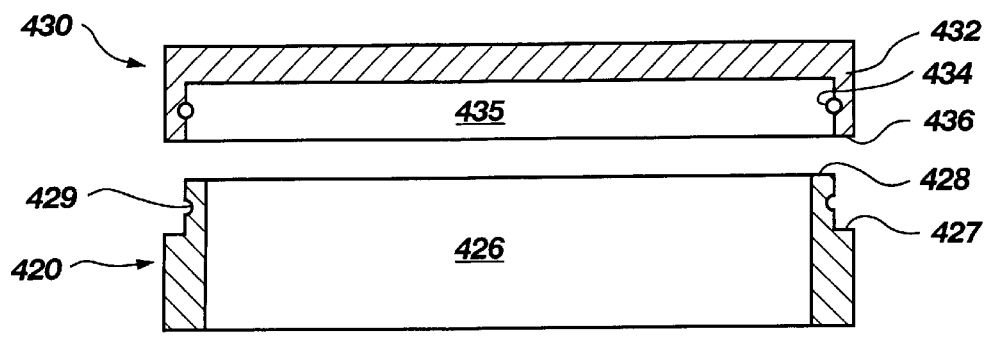
FIGS. 4a through 4c are cross-sectional views of exemplary alignment device-cover combinations that are useful in the assembly of FIG. 1a which illustrate various mechanisms for securing the cover to the alignment device.

FIG. 4a shows a preferred configuration of an alignment device 420 and its complementary cover 430. The top 428 of alignment device 420 is adapted to receive and engage cover 430. Preferably, the top 428 of alignment device 420 is recessed around the entire perimeter thereof. A shoulder 427, which extends around the entire perimeter of alignment device 420, separates recessed top 428 from the remainder of the alignment device. Cover 430 includes a downwardly extending perimeter, which is referred to as lip 432.

Preferably, lip 432 is shaped complementary to recessed top 428 of alignment device 420. Lip 432 defines a receptacle 435 in cover 430, which is adapted to receive the top 428 of alignment device 420. Lip 432 also includes a bottom edge 436, which rests upon shoulder 427 of alignment device 420 as cover 430 is disposed on the alignment device. As cover 430 is placed over top 428 of alignment device 420, the top of the alignment device is inserted into receptacle 435 of the cover. Preferably, when cover 430 is disposed on alignment device 420, the outer surfaces of the sides of the alignment device and the cover are flush.

With continued reference to FIG. 4a, a fist variation of a cover engagement mechanism 429 and its corresponding alignment device engagement mechanism 434 are shown. Recessed top 428 of alignment device 420 includes a horizontal, elongate groove 429 (the cover engagement mechanism) formed therein. On cover 430, one or more ridges 434 (the alignment device engagement mechanism), which are complementary to groove 429, extend slightly into receptacle 435 from the inner surface of lip 432. Ridge 434 is preferably manufactured from a compressible, resilient material such as polyurethane, silicone rubber, latex, or other resilient thermoplastic material. Thus, as cover 430 is disposed over alignment device 420, ridge 434 compresses as it is forced downward along the recessed top 428 of the alignment device. When ridge 434 overlaps groove 429, the ridge expands to substantially its original shape and size to secure itself into the groove and secure cover 430 to alignment device 420. In order to remove cover 430 from alignment device 420, sufficient upward force must be applied to the cover to compress ridge 434 and pull it from groove 429.

Figure 4B:
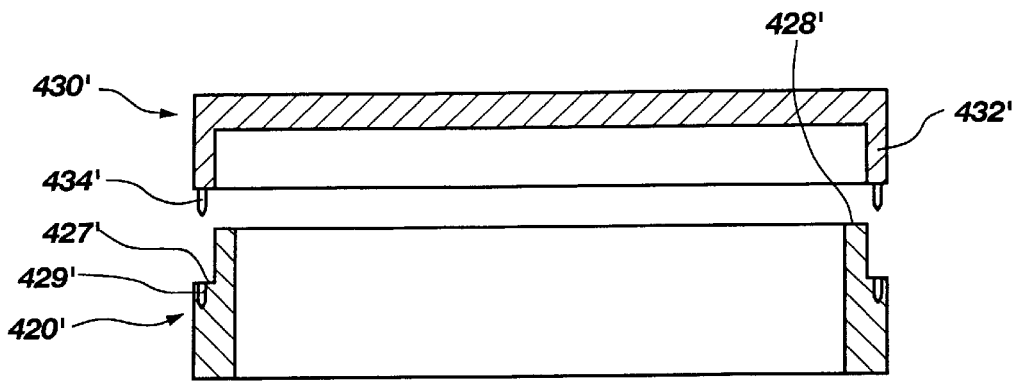

FIG. 4b illustrates a second variation of a cover engagement mechanism 429' and its corresponding alignment device engagement mechanism 434'. Alignment device engagement mechanism 434' includes a plurality of protrusions which extends downwardly from cover 430'. Cover engagement mechanism 429' includes a plurality of receptacles which opens through shoulder 427' and extends downward through the lower portion of alignment device 420'. Receptacles of cover engagement mechanism 429' align with and are complementary to protrusions 434'. Thus, as protrusions 434' are inserted into receptacles 429', they mate with receptacles 429 and are secured thereby, securing cover 430' to alignment device 420'.

Figure 4C:
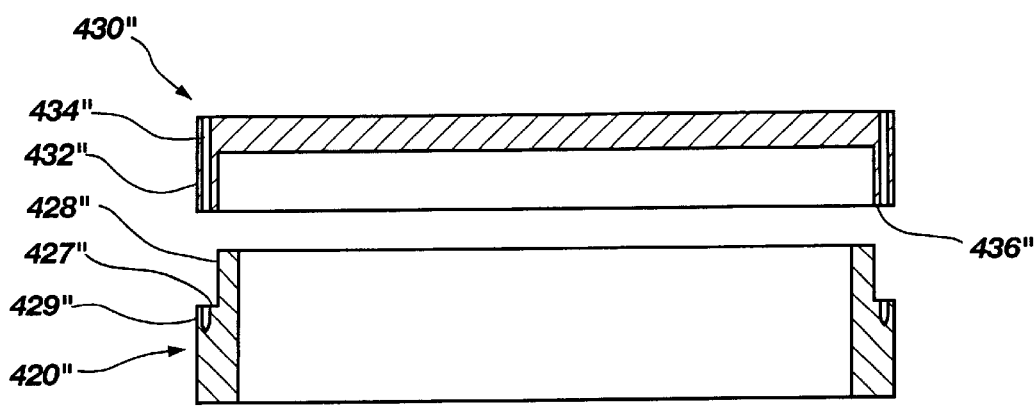

FIG. 4c depicts a third variation of a mechanism for securing a cover 430" to an alignment device 420". A plurality of bores 434" extends downward through lip 432" of cover 430". As cover 430" is disposed on alignment device 420", bores 434" align with complementary downwardly extending bores 429" formed in the alignment device through shoulder 427". A securing mechanism 436", such as a screw, a retaining pin, or another elongate fastener, is then inserted into each of cover bores 434" and their respective alignment device bores 429", and secured within the alignment device bores to secure cover 430" to alignment device 420".

Referring to FIG. 4d, a fourth variation of an alignment device securing mechanism is shown, wherein the cover 130 includes a downwardly extending securing element 134. Preferably, securing element 134 is a resilient, outwardly forcible, integrally molded leaf spring which comprises a latch 135 near the bottom thereof. Latch 135 faces inwardly relative to cover 130. A corresponding receptacle 129 formed in alignment device 120 receives latch 135 as cover 130 is placed over the alignment device. Thus, as cover 130 is placed over alignment device 120, securing element 134 is flexed outward until latch 135 reaches receptacle 129. As latch 135 overlaps receptacle 129, securing element 134 snaps back to its relaxed state, securing the latch within the receptacle, thereby securing cover 130 to alignment device 120.

Other mechanisms which secure a cover to an alignment device are also within the scope of the present invention. Contact elements which establish and maintain a constant bias of the vertically mountable semiconductor device's stub contacts against their corresponding carrier substrate leads as the vertically mountable semiconductor device is disposed within an alignment device, other than a cover, are also contemplated as being within the scope of the invention. Such contact elements include, but are not limited to, spring loaded devices, latches, levers and snap-fit-type bosses which are part of the alignment device or insertable therein, and which hold the vertically mountable semiconductor device within the alignment device receptacle. Alternative contact elements may apply downward force to the top of a vertically mountable semiconductor device or engage a portion of the vertically mountable semiconductor device to exert a downward force thereupon.

Figure 5:
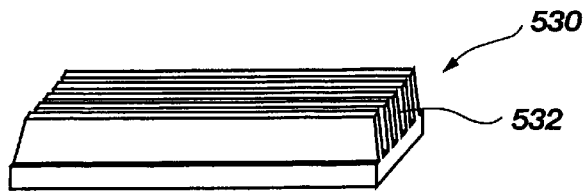
FIG. 5 is a frontal perspective view of another variation of the cover which includes a heat sink mechanism thereon.

FIG. 5 illustrates a cover 530 which includes a heat sink 532 thereon. As mentioned above, the cover may be made from a heat sink material.

Figure 6:
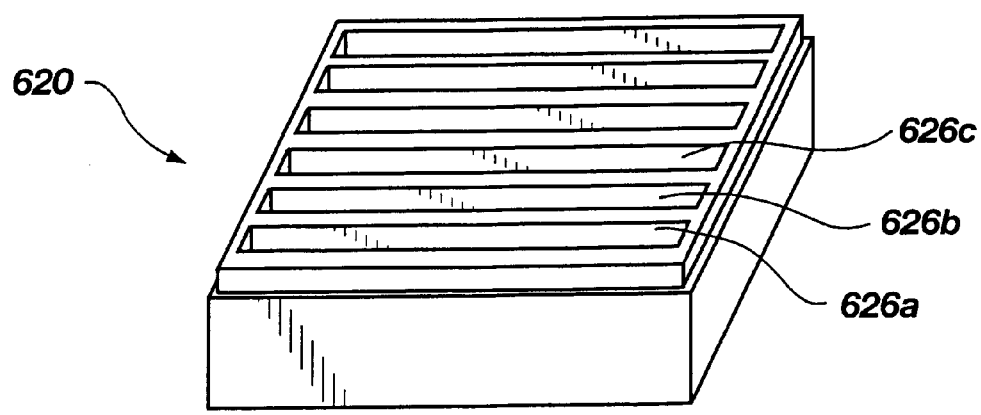
FIG. 6 is a frontal perspective view of another variation of the alignment device which includes a plurality of package receptacles.

FIG. 6 illustrates an alternative variation 620 of the alignment device, which includes a plurality of receptacles 626a, 626b, 626c, etc. defined thereby in a serial arrangement. Other variations of the alignment device may include only one receptacle or a plurality of receptacles in a matrix-type arrangement. In variations of the alignment device which include a plurality of receptacles, some of the receptacles may remain empty so that the computer or other device within which the assembly of the present invention is installed may be upgraded in the future by inserting additional vertically mountable semiconductor devices into the empty receptacles. Alternatively, each of the receptacles of such multi-receptacle alignment devices may include a vertically mountable semiconductor device.

Figure 7:
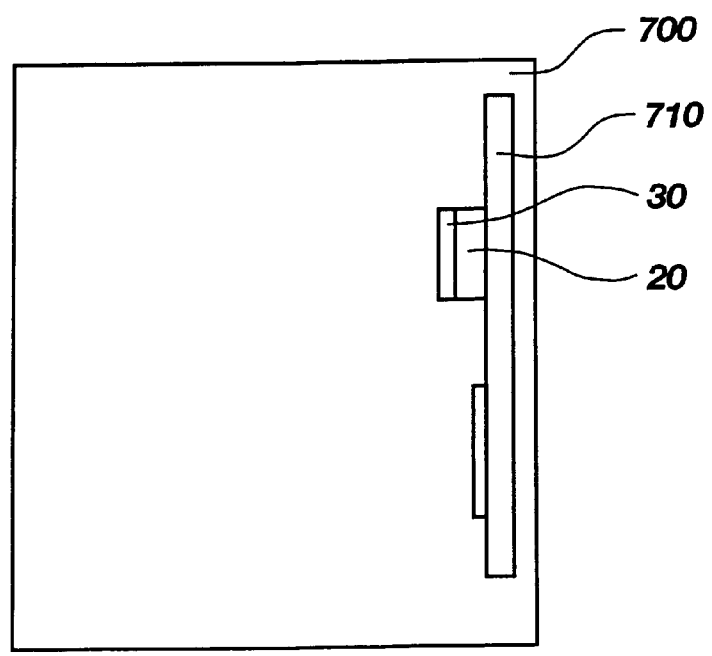
FIG. 7 is a schematic representation of the vertically mountable semiconductor device assembly in a computer.

FIG. 7 depicts a computer 700 which includes a carrier substrate 710 therein. Alignment device 20, which includes one or more vertically mountable semiconductor devices (not shown) disposed therein, is attached to carrier substrate 710. A cover 30 is disposed over alignment device 20 to establish and maintain an electrical connection between the vertically mountable semiconductor device(s) and carrier substrate 710. Thus, the vertically mountable semiconductor device(s) is (are) operatively incorporated into computer 700.

Referring again to FIG. 1a, in use, alignment device 20 is mounted to carrier substrate 40 with an attachment mechanism 25. One or more vertically mountable MS4 5 semiconductor devices 10 are inserted into receptacle(s) 26 of alignment device 20. A contact element, such as cover 30, is disposed against vertically mountable semiconductor device(s) 10 to bias the vertically mountable semiconductor devices against carrier substrate 40. Cover 30 exerts sufficient force on vertically mountable semiconductor device(s) 10 to establish and maintain an electrical connection between stub contacts 12 and their corresponding terminals (not shown) on carrier substrate 40. Disengagement of cover 30 facilitates the ready removal of the vertically mountable semiconductor device(s) 10 from alignment device 20. Consequently, each vertically mountable semiconductor device 10 is readily removable from receptacle 26 and may also be readily replaced therein.

The features of the vertically mountable semiconductor device and alignment device of the present invention provide several advantages over many vertically mountable semiconductor devices in the prior art. First, the vertically mountable semiconductor device includes short stub contacts. Consequently, the vertically mountable semiconductor device has relatively low impedance when compared with many vertically mountable semiconductor devices in the prior art. Second, the alignment device and removable cover of the present invention establish an electrical connection between a vertically mountable semiconductor device and a carrier substrate. Such electrical connections are preferably made by a z-axis elastomer or interference fit, both of which are readily disconnected. Advantageously, the assembly of the present invention is readily user-upgradable. Moreover, vertically mountable semiconductor devices are readily installable within the alignment device, and a cover or other mechanism forces the vertically mountable semiconductor device against a carrier substrate to effect an operative connection between the vertically mountable semiconductor device and the carrier substrate. Thus, the assembly establishes and maintains adequate electrical connections between the vertically mountable semiconductor device and the carrier substrate.

Although the foregoing description contains many specificities, these should not be construed as limiting the scope of the present invention, but merely as providing illustrations of selected presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are embraced within their scope.

What is claimed is:

1. An assembly, comprising:
   at least one vertically mountable semiconductor device package having a horizontal bottom edge;
   an integrated ciruit die disposed within said package;
   a plurality of leads, each of said plurality of leads extending outward from a bottom edge of said package, at least a portion of said plurality of leads in communication with said integrated circuit die; and
   an alignment device with a plurality of receptacles therein, each of said plurality of receptacles being configured to removably receive said at lest one vertically mountable semiconductor device package and to align said at least one vertically mountable semiconductor device package relative to a substrate.

2. The assembly of claim 1, wherein said each of said plurality of leads extends less than about one millimeter past said bottom edge.

3. The assembly of claim 1, wherein said each of said plurality of leads extends less than about one-half millimeter past said bottom edge.

4. The assembly of claim 1, wherein said each of said plurality of leads extends about 10 mils or less past said bottom edge.

5. The assembly of claim 1, wherein said each of said plurality of leads is substantially non-deformed.

6. The assembly of claim 1, wherein said each of said plurality of leads extends substantially perpendicular to said bottom edge.

7. The assembly of claim 1, wherein each of said plurality of receptacles is configured to facilitate removal and replacement of said at least one vertically mountable semiconductor device package by at least one of another vertically mountable semiconductor device package and an upgrade thereof.

8. The assembly of claim 1, wherein each of said plurality of receptacles is configured such that a semiconductor device package disposed therein is separately removable from another semiconductor device package disposed in another of said plurality of receptacles.

9. A vertical surface mount package assembly, comprising:
   at least one vertically mountable semiconductor device including a plurality of stub contacts extending from a bottom edge thereof;
   an alignment device configured to be secured to a carrier substrate and including a plurality of receptacles, each of said plurality of receptacles being configured to removably receive said at least one vertically mountable semiconductor device and to align at least some of said plurality of stub contacts relative to a corresponding terminal on said carrier substrate; and
   at least one contact element configured to bias said at least one vertically mountable semiconductor device against said carrier substrate.

10. The assembly of claim 9, wherein said at least one contact element is a cover disposable over said alignment device.

11. The assembly of claim 9, wherein said at least one contact element includes a depressor component protruding therefrom.

12. The assembly of claim 9, wherein each of said plurality of stub contacts of said at least one vertically mountable semiconductor device extends perpendicular to said bottom edge.

13. The assembly of claim 9, wherein each of said plurality of stub contacts is straight.

14. The assembly of claim 9, wherein each of said plurality of stub contacts extends a length of less than about one millimeter from said bottom edge.

15. The assembly of claim 9, wherein each of said plurality of stub contacts extends a length of less than about one-half millimeter from said bottom edge.

16. The assembly of claim 9, wherein each of said plurality of stub contacts extends about 10 mils or less from said bottom edge.

17. The assembly of claim 9, wherein at least one of said alignment device and said at least one contact element is manufactured from a heat sink material.

18. The assembly of claim 9, wherein each of said plurality of receptacles is configured to facilitate removal and replacement of said at least one vertically mountable semiconductor device by at least one of another vertically mountable semiconductor device and an upgrade thereof.

19. The assembly of claim 9, wherein each of said plurality of receptacles is configured such that a semiconductor device disposed therein is separately removable from another semiconductor device disposed in another of said plurality of receptacles.

20. An alignment device for securing at least one vertically mountable semiconductor device to a carrier substrate, the alignment device comprising:
   a body;
   a plurality of receptacles formed in said body, each of said plurality of receptacles being configured to removably receive the at least one vertically mountable semiconductor device;

at least one contact element configured to bias the at least one semiconductor device against the carrier substrate and a cover disposable over said receptacles so as to exert a downward force on a vertically mountable semiconductor device therein.

21. The alignment device of claim 20, wherein said at least one contact element includes a depressor component protruding therefrom.

22. The alignment device of claim 20, wherein at least one of said body and said at least one contact element are manufactured from a heat sink material.

23. The alignment device of claim 20, wherein each of said plurality of receptacles is configured to facilitate removal and replacement of said at least one vertically mountable semiconductor device by at least one of another vertically mountable semiconductor device and an upgrade thereof.

24. The alignment device of claim 20, wherein each of said plurality of receptacles is configured such that a semiconductor device disposed therein is separately removable from another semiconductor device disposed in another of said plurality of receptacles.

25. A computer comprising:

a carrier substrate;

at least one alignment device including a plurality of receptacles and at least one contact element disposable over said plurality of receptacles, said at least one alignment device being secured to said carrier substrate; and at least one vertically mountable semiconductor device removably insertable within each of said plurality of receptacles, said at least one contact element biasing said at least one vertically mountable semiconductor device against said carrier substrate, said at least one vertically mountable semiconductor device having a bottom edge with a plurality of stub contacts extending therefrom.

26. The computer of claim 25, wherein said plurality of stub contacts extend about 10 mils or less from said bottom edge.

27. The computer of claim 25, wherein each of said plurality of receptacles is configured to facilitate removal and replacement of said at least one vertically mountable semiconductor device by at least one of another vertically mountable semiconductor device and an upgrade thereof.

28. The computer of claim 25, wherein each of said plurality of receptacles is configured such that a semiconductor device disposed therein is separately removable from another semiconductor device disposed in another of said plurality of receptacles.

* * * * *